United States Patent [19]
Nishino et al.

[11] Patent Number: 5,183,725
[45] Date of Patent: Feb. 2, 1993

[54] ELECTRODE PATTERN FORMING METHOD

[75] Inventors: Hiromi Nishino; Keiji Tarui, both of Kitakatsuragi; Hideyuki Toyoshi, Tenri; Tatsuo Morita, Souraku, all of Japan

[73] Assignee: Sharp Kabushiki Kaisha, Osaka, Japan

[21] Appl. No.: 592,443

[22] Filed: Oct. 1, 1990

[30] Foreign Application Priority Data
Oct. 3, 1989 [JP] Japan .................................. 1-259857
Nov. 22, 1989 [JP] Japan .................................. 1-303772

[51] Int. Cl.$^5$ .............................................. G03F 7/00
[52] U.S. Cl. ...................................... 430/313; 430/20;
430/311; 430/318; 156/643; 156/659.1;
156/660; 204/129.3; 204/129.65; 204/131
[58] Field of Search ................. 430/20, 311, 313, 318,
430/322, 325; 204/129.3, 129.65, 146, 131;
156/643, 659.1, 660

[56] References Cited
U.S. PATENT DOCUMENTS
4,549,944 10/1985 Pliefke .................................. 430/299
4,614,570 9/1986 Pliefke .............................. 204/129.65

Primary Examiner—Marion E. McCamish
Assistant Examiner—Kathleen Duda
Attorney, Agent, or Firm—Nixon & Vanderhye

[57] ABSTRACT

An electrode pattern forming method comprising the steps of: forming a transparent conductive film on a substrate, covering said transparent conductive film with an aluminum film, forming a resist material film for etching on said aluminum film, exposing said resist material film followed by developing by immersing said substrate in an electrolyte to form a resist pattern, and patterning said aluminum film using said resist pattern as a mask;
the formation of said resist pattern in said electrolyte being conducted with another transparent conductive film which is in direct contact with said electrolyte and electrically connected to said aluminum film.

22 Claims, 7 Drawing Sheets

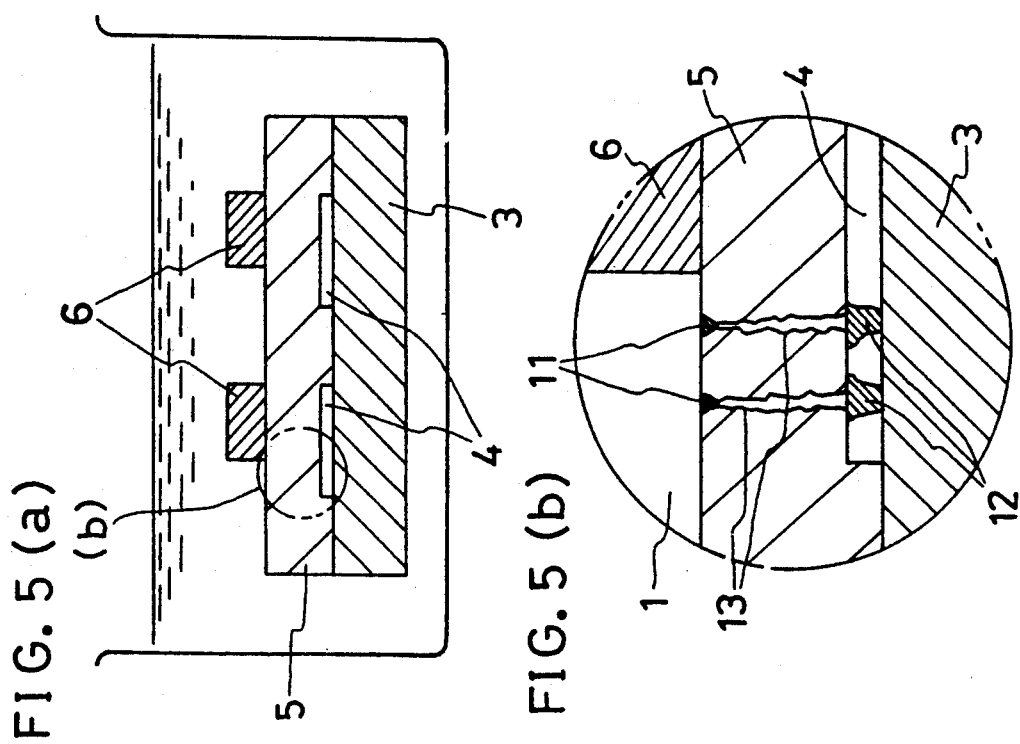
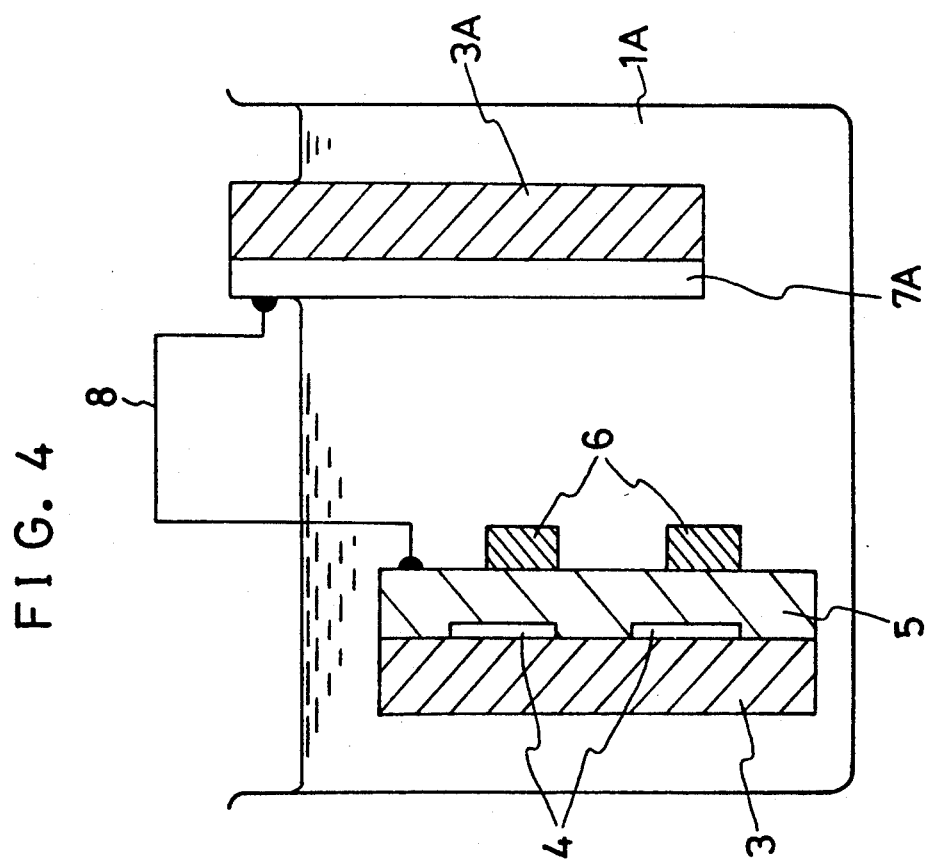

5,183,725

ELECTRODE PATTERN FORMING METHOD

BACKGROUND OF THE INVENTION

1. Field of the Invention

This invention relates to an electrode pattern forming method, and in particular, to a method which is applicable to a liquid crystal display device, an electroluminescence display device, a contact type image sensor which is composed of a photodiode array, etc. The method is used when forming that portion of these devices where transparent electrodes and Al electrodes are stacked on each other. This electrode pattern forming method protects the lower, transparent electrodes from corrosion when processing the Al electrodes by photoetching or the like.

2. Description of the Related Art

Transparent electrodes are used in display devices such as liquid crystal display devices (LCD) and electroluminescence display devices (ELD), and in electronics devices such as image sensors composed of photodiodes and/or photodiode arrays. In, for example, one electrode pattern forming method which is commonly used, an transparent conductive film is used, which is prepared by adding $SnO_2$ to the main constituent $In_2O_3$, conventionally known as indium-tin-oxide (ITO). An Al film with a low electrical resistance is formed on this ITO transparent conductive film for the purpose of providing wiring.

Normally, such an electrode pattern is formed as follows: first, a transparent film is formed on a substrate. Then, an Al film is formed on this transparent conductive film by evaporation, sputtering or the like. The Al film thus formed is processed into a predetermined electrode pattern by photoetching.

A resist material is used when forming an electrode pattern by photoetching; resist materials are of two types: negative and positive. In cases where high accuracy is required, positive type resist materials are preferred since they provide better resolution. When developing a positive type resist material, an alkaline developer is normally used. This, however, involves a problem, which will be described below with reference to FIG. 5(a). Here, an Al film 5 is formed on ITO electrodes 4, which are formed on a substrate 3, for the purpose of forming Al electrodes by photoetching. If a positive type resist material is used in this process, the ITO electrodes 4 can be corroded by the electrolyte 1, which serves as the developer for the resist material 6 on the Al film 5. Conventionally, this corrosion has been avoided by appropriately adjusting the developing time. That is, the time it takes for corrosion to take place is ascertained empirically and is taken into account when adjusting the developing time.

The corrosion of the ITO electrodes takes place as follows: let us imagine, as shown in FIG. 5(b), that local active corrosion points 11 have come into existence on the surface of the Al film 5. These active corrosion points 11 may be attributable to impurity segregation, distortion, or lattice defects. When this Al film 5 is immersed in the developer, i.e., the electrolyte 1, dissolution of Al occurs at the active corrosion points 11, with the result that microscopic pinholes 13 are generated in the Al film 5. Thus, a local cell is formed by the Al film 5, the ITO electrodes 4 and the electrolyte 1. In the corroded portions 12 of the ITO electrodes 4, $In_2O_3$, which is the main constituent of ITO, is metallized through reduction and acts as one electrode of the above-mentioned cell. Thus, the rate of corrosion depends to a large degree on the thickness of the Al film or the quality thereof, or the quality of the ITO film. When forming an ITO film, an Al film or the like on a substrate, it is a more or less common phenomenon that the thickness and quality of the film vary depending on its position on the substrate. The thickness and quality of the film also change as the film formation is repeated.

Accordingly, the rate at which the ITO film is corroded is subject to changes, so that, with the conventional method, in which protection from corrosion is attained by adjusting developing time, it is difficult to avoid corrosion entirely. This is particularly true when the electrode formation area is relatively large. In addition, the degree to which the corrosion is avoided differs from substrate to substrate, thus making it difficult to increase the yield.

SUMMARY OF THE INVENTION

This invention has been made in view of the problem mentioned above. It is accordingly an object of this invention to make it possible to protect a transparent conductive film such as an ITO film from corrosion regardless of the length of time during which it is immersed in developer.

In accordance with this invention, there is provided an electrode pattern forming method comprising the steps of: forming a transparent conductive film on a substrate; forming an aluminum film on the transparent conductive film in such a manner as to cover the same; forming a resist material film for etching on the aluminum film; exposing the resist material film; developing the resist material film by immersing the substrate, after the exposure of the resist material film, in an electrolyte so as to obtain a resist pattern; and patterning the aluminum film using the resist pattern as a mask;

the formation of the resist pattern by means of the electrolyte being conducted with another transparent conductive film, which is in direct contact with the electrolyte, being electrically connected to the aluminum film.

BRIEF DESCRIPTION OF THE DRAWINGS

FIG. 4 is a process drawing illustrating a second embodiment of this invention;

FIGS. 5(a) and 5(b) are process drawings showing a prior art example;

DETAILED DESCRIPTION OF THE PREFERRED EMBODIMENTS

Figure 1:
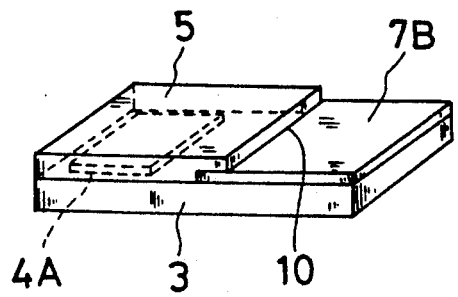
FIGS. 1(a), 1(b) and 1(c) are process drawings illustrating a first embodiment of this invention.
Figure 1:
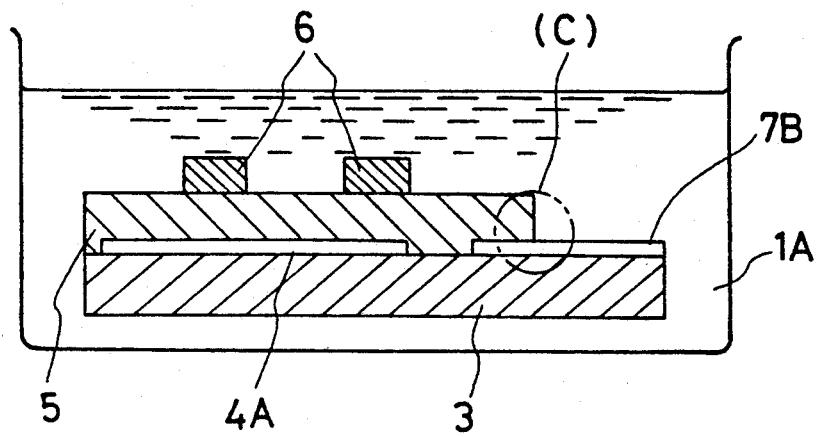
Figure 1:
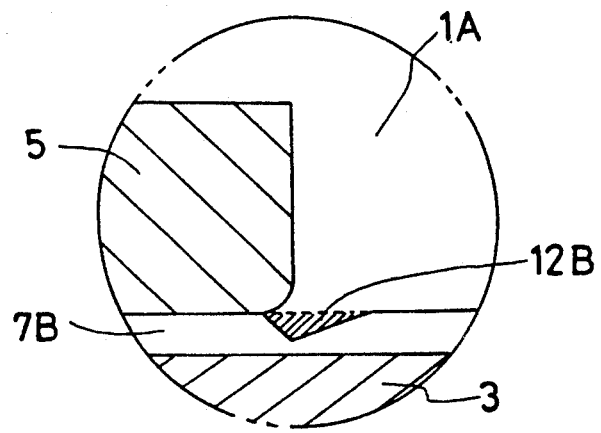

Although the transparent conductive film in this invention may consist of an ITO film as described above, it is also possible to adopt other types of well-known transparent conductive films. The transparent conductive film is formed in a predetermined configuration on a predetermined type of substrate (glass substrate, plastic substrate, semiconductor substrate, etc.) by the CVD method, sputtering method or the like. The aluminum film, which covers the transparent conductive film formed on the substrate, is formed by the PVD method, sputtering or the like. Normally, the aluminum film is formed in such a manner as to completely cover and contact the transparent conductive film. The appropriate range of thickness of the aluminum film is normally from 0.5 to 2.0 μm.

Subsequently, a resist material film, e.g. photoresist, for etching the Al film is formed on this substrate, on which the transparent conductive film and the Al film have been stacked. Various known resist material of positive type or negative type can be used for this resist material film. For example, an acrylate type resist material or a synthetic rubber type resist material which cures by ultraviolet radiation or the like may be adopted as the negative type resist material. A quinonediazide type resist material may be adopted as the positive type resist material. To form this resist material film, a well-known resist material such as the one mentioned above is dissolved in an organic solvent and the solution thus obtained is applied to the Al film and dried. Although there is no particular limitation to the thickness of this resist material film, the appropriate thickness is normally in the range of 1.0 to 2.0 μm.

When the above resist material film has been exposed (by means of ultraviolet radiation, an electron beam or the like) in a predetermined pattern, the substrate, which is equipped with the transparent conductive film, the Al film, and the resist material film, is immersed in an electrolyte solution, thereby developing the resist material film to obtain a predetermined resist pattern. The electrolyte solution used may be an aqueous solution of a well-known electrolyte. When, for example, a positive type resist material film is used, it is desirable that a sodium phosphate type alkaline solution (the pH of which is in the range of 8 to 13) be used.

In accordance with this invention, an additional transparent conductive film is electrically connected to the aluminum film when performing the development using the above electrolyte solution. This additional transparent conductive film (hereinafter referred to as the "auxiliary conductive film") must be in direct contact with the electrolyte solution during development. The auxiliary transparent conductive film may be formed on the above-mentioned substrate in such a manner as to be in contact with the Al film, or, alternatively, it may be formed on another substrate and connected to the Al film through external wiring. The former arrangement is preferable because of its simplicity. For, with that arrangement, the transparent conductive film to be protected from corrosion and the auxiliary transparent conductive film can be formed simultaneously and on the same substrate. Concrete examples of the formation pattern of the auxiliary transparent conductive film are shown in the examples, etc. described below. If necessary, the transparent conductive film to be protected from corrosion and the auxiliary transparent conductive film may constitute one continuous film.

The effects of this auxiliary transparent conductive film will be described with reference to the case where it is applied to an ITO film.

When a local cell is formed between an ITO film and an Al film through the electrolyte, the ITO film begins to be corroded, with inducing a concentration polarization on the ITO film depending upon the rate at which the reactants are diffused and supplied from the electrolyte solution. The corrosion of the ITO film, which is covered with the Al film, takes place through the pinholes formed in the Al film situated above the ITO film. In contrast, the auxiliary ITO film, which is arranged in such a manner as to be in contact with the electrolyte solution, suffers corrosion, not in small closed areas like pinholes but over a wide open area, so that the reactants are diffused and supplied speedily. Further, since the generation of corroded products per unit area is less than in the pinholes, concentration polarization occurs to a smaller degree than in the case of the ITO film which is to be protected from corrosion. Accordingly, when an auxiliary ITO film which is electrically connected to the Al film is used, the ITO film which is to be protected from corrosion is electrically connected to this auxiliary ITO film, and, at the same time, a local potential difference is not generated between the two ITO films, with the result that the corrosion is concentrated on the auxiliary film. By thus using the auxiliary ITO film as a sacrifice anode, the corrosion of the ITO film to be protected can be mitigated.

A corrosion inhibitor for the Al film may be added to the electrolyte solution when developing the resist material film. In particular, the inventors of this invention found that, by adding a saccharose such as D-glucose to the electrolyte solution, the corrosion of the Al film is mitigated, thus enchancing the protection of the transparent conductive film from corrosion. The amount of the D-glucose added may preferably be in the range of 1.0 to 3.0 weight percent(wt %).

The aluminum film is patterned using the resist pattern, which has been thus developed, as the mask, thereby obtaining the desired aluminum electrodes. The patterning may be performed by the usual wet etching method.

EXAMPLE 1

In the examples shown in FIGS. 1 to 8, the auxiliary ITO film and the ITO film to be protected from corrosion are formed on the same substrate.

As shown in FIGS. 1(a) and 1(b), an ITO film 4A which is to be protected from corrosion and an auxiliary ITO film 7B were formed on a glass substrate 3, by EB evaporation. Further, an Al film 5 was formed by sputtering. The ITO film 4A to be protected from corrosion was completely covered with the Al film 5, whereas an edge portion of the auxiliary ITO film 7B overlapped the Al film 5, defining a borderline 10 with a length of 5 mm. The area of the Al film 5 was 200 mm² and that of the auxiliary ITO film 7B was 50 mm². The thickness of the ITO film was 700 Å and its sheet resistance was 50 Ω/□. The thickness of the Al film was 1.6 μm. A positive type resist material (quinonediazide type) was applied to this specimen Al film 5, exposed, and developed in a phosphate-type developer 1A (pH 13), thereby forming a resist pattern 6. No corrosion was found on the ITO film 4A to be protected from corrosion, whereas, as shown in FIG. 1(c), corrosion 12B was concentrated on the boundary section between the Al film 5 and the auxiliary ITO film 7B.

Figure 2:
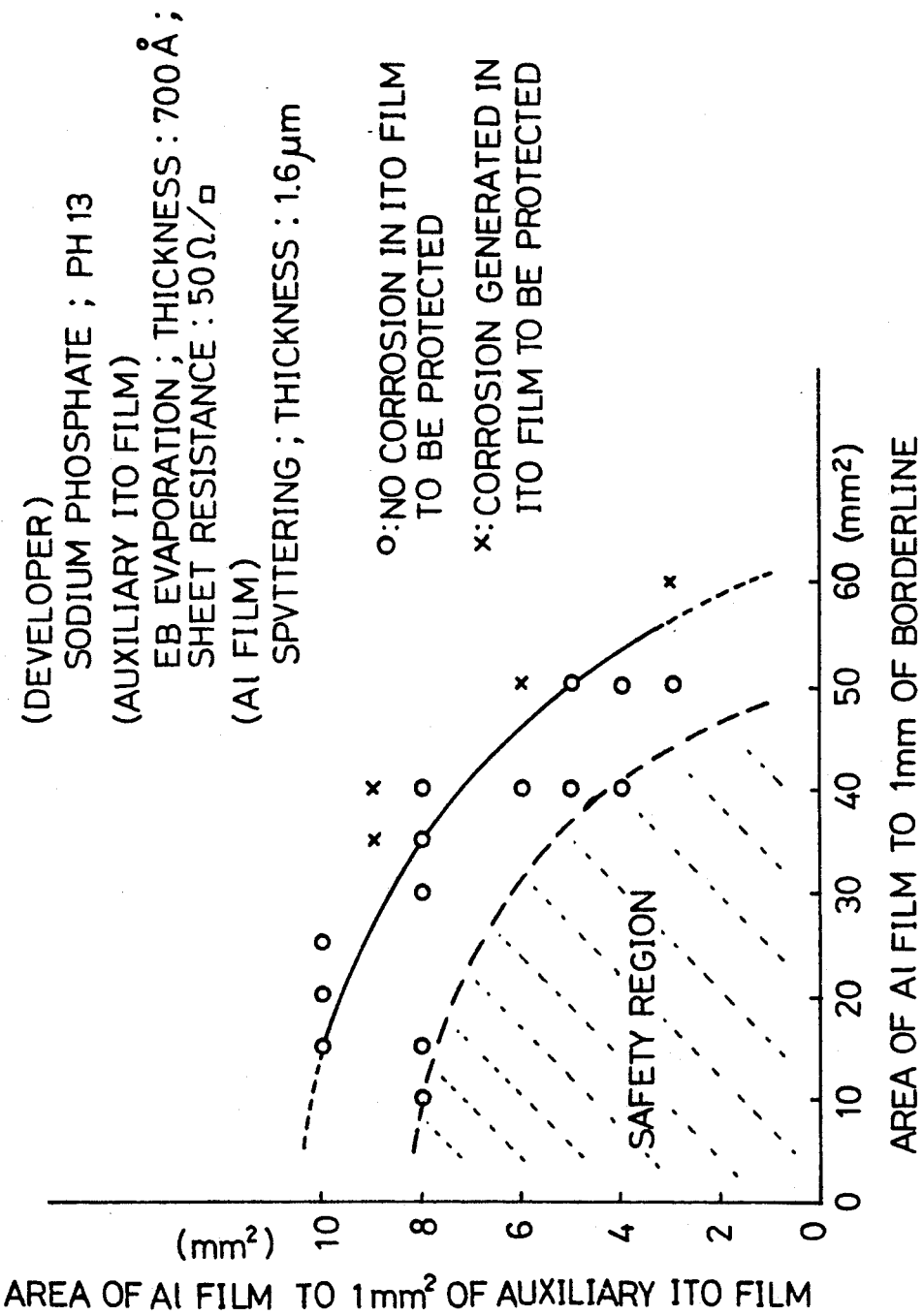
FIG. 2 is a graph showing the relationship between the area of the Al film to 1 mm of the borderline, the area of Al film to 1 $mm^2$ of the auxiliary ITO film, and the degree of corrosion in the ITO film to be protected in the first embodiment.
Figure 3:
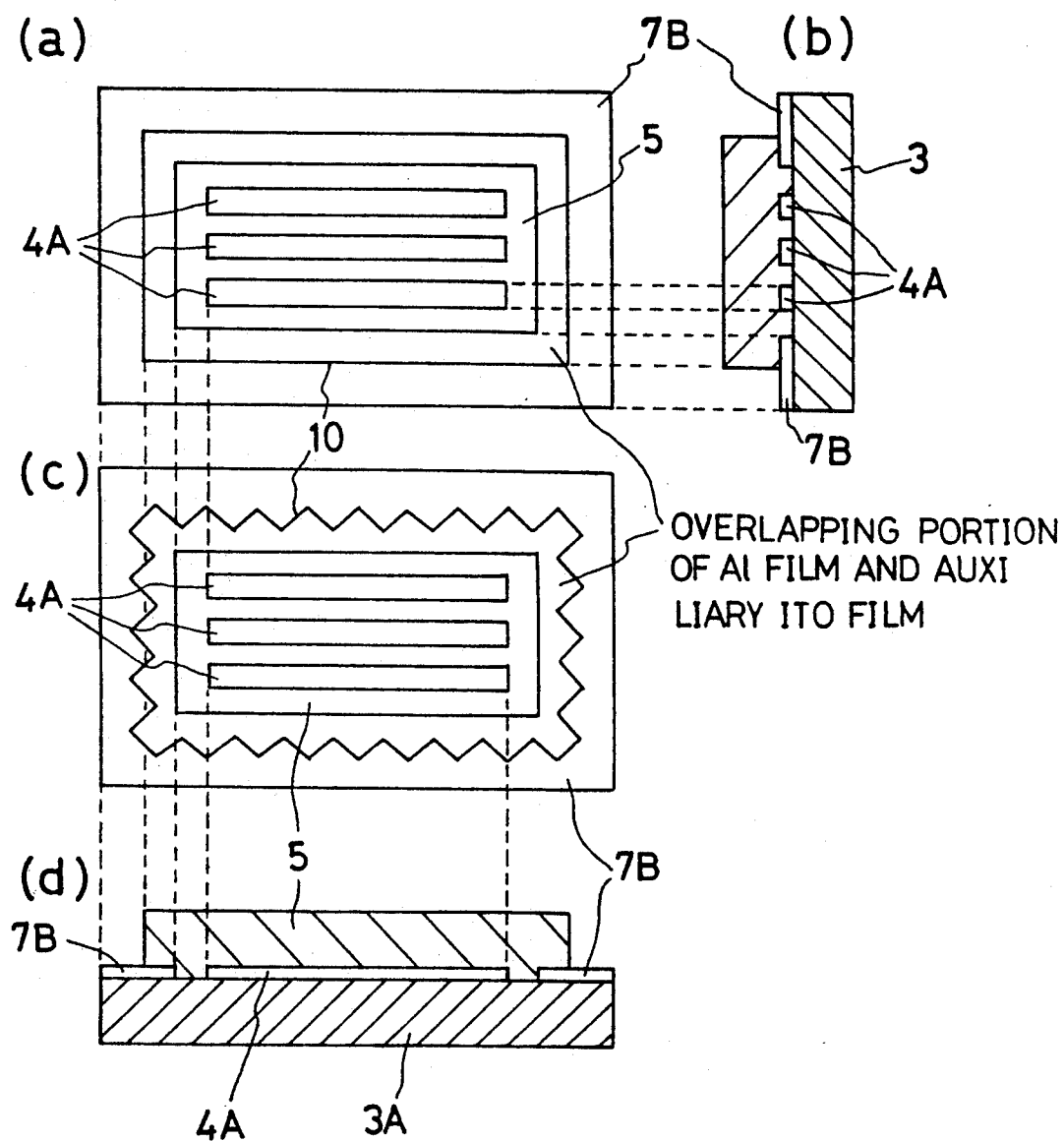
FIGS. 3(a) to 3(d) show an example of the configuration of the auxiliary ITO film.

Next, a specimen prepared in the same way as the above one was examined keeping the borderline 10 constant while changing the the area of the auxiliary ITO film 7B and that of the Al film 5. FIG. 2 shows the results of the examination. When the area of the Al film 5 was changed, that of the ITO film 4A to be protected from corrosion was also changed so that its size would be the same as that of the Al film 5. The results obtained showed that there exists a relationship between the area of the Al film, i.e., the corrosion-proof region, and the area of the ITO film 4A to be protected from corrosion, the auxiliary ITO film needing more than a certain amount of area depending on the size of the corrosion-proof region. The "safety region" in FIG. 2 means that corrosion can be avoided with 100% certainty.

Further, a specimen in which the borderline 10, having a length of 10 mm, was made zigzag without changing the area of the ITO film 7B and the Al film 5. The specimen was examined for corrosion. The result of the examination showed that the corrosion of the ITO film 4A can be avoided with an ITO film having a smaller area as compared to the case where the borderline is 5 mm.

It has been found from these examinations that there exist an arrangement and configuration of the auxiliary ITO film 7B which would help avoid corrosion effectively and positively. Examples of such configuration are shown in FIGS. 3(a) and 3(b). When there is a limitation to the area of the auxiliary ITO film, the configuration shown in FIGS. 3(c) and 3(d) may be adopted, which provide more effective protection from corrosion than the configuration shown in FIGS. 3(a) and 3(b).

In the relationship shown above, the absolute correlation changes depending on the film quality of the auxiliary ITO film, etc.; the lower the resistance of the auxiliary ITO film and the smaller the thickness thereof, the more effective protection from corrosion it provides, making it possible to avoid corrosion with an ITO film with a smaller area.

EXAMPLE 2

In the example shown in FIG. 4, the Al film is connected to an ITO film formed on another substrate. ITO electrodes 4 were formed on a glass substrate 3 having a size of 1.5×4 cm. An Al film 5 was formed on them in such a manner as to cover them entirely. A positive type resist material was applied to this Al film 5 and was then exposed. Next, the Al film 5 was immersed, together with the substrate 3, in a sodium phosphate type developer 1A (PH 13) so as to develop it, thereby forming a resist pattern 6. In this process, an auxiliary ITO film 7A which is formed on another glass substrate 3A was connected to the Al film 5 through external wiring 8, the auxiliary ITO film 7A being immersed in the developer 1 to a depth of 2 cm. After the development, the ITO electrodes 4 exhibited no sign of corrosion, no such defects as pinholes being generated.

In the case where the connection through the external wiring 8 was not effected, microscopic corrosion was observed in the ITO electrodes 4, defects such as pinholes being generated.

REFERENCE EXAMPLE 1

Figure 6:
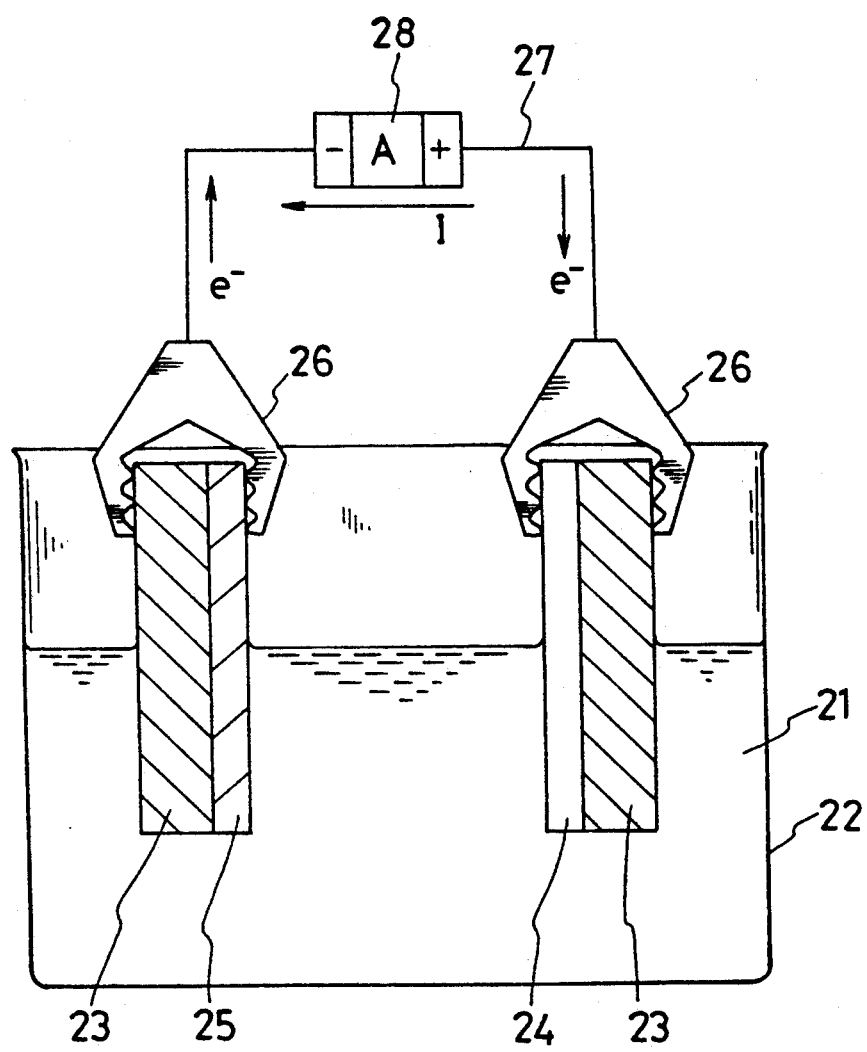
FIGS. 6 to 8 are reference drawings for illustrating the effects obtained by the addition of D-glucose.

FIG. 6 shows a testing cell, in which two substrates, each consisting of a glass substrate 23 (each of which had a size of 40 mm × 15 mm and a thickness of 1.1 mm), were disposed. One substrate was equipped with an Al film 25 formed by sputtering and having a thickness of 8000 Å, whereas the other substrate was equipped with an ITO film 24 formed by electron beam evaporation (EB) and having a thickness of 700 Å. These two substrates were immersed in an electrolyte 21 in a small bath 22, each being suspended by means of an alligator clip 26, which was connected to external wiring 27.

In the above arrangement in the testing cell, the degree of electrochemical corrosion caused in the ITO film 24 and the Al film 25 by the electrolyte 21 can be assessed by measuring the change with passage of time in the current flowing from the ITO film electrode 24 to the Al film electrode 25 as from the time when the two electrodes are connected to each other through the external wiring 27. This measurement may be conducted by means of a digital multimeter 28 or the like. In this example, the following seven types of developers (A) to (G), which are set forth in Table 1, were used.

TABLE 1

| No. | Developers Composition | Amount of G-Glucose added |
|---|---|---|
| (A) | Undiluted solution of (α)* | 0 g/100 cc |
| (B) | Undiluted solution of (β)* | 0 g/100 cc |
| (C) | 1:1 diluted solution of (β) | 0 g/100 cc |
| (D) | Undiluted solution of (β) | 1 g/100 cc |
| (E) | Undiluted solution of (β) | 2 g/100 cc |
| (F) | Undiluted solution of (β) | 3 g/100 cc |
| (G) | 1:1 diluted solution of (β) | 2 g/100 cc |

[Notes](a) consists of MF DC-26 manufactured by Shipley, and (β) consists of Microposite Developer manufactured by Shipley (Both of them are alkaline electrolytes).

Figure 7:
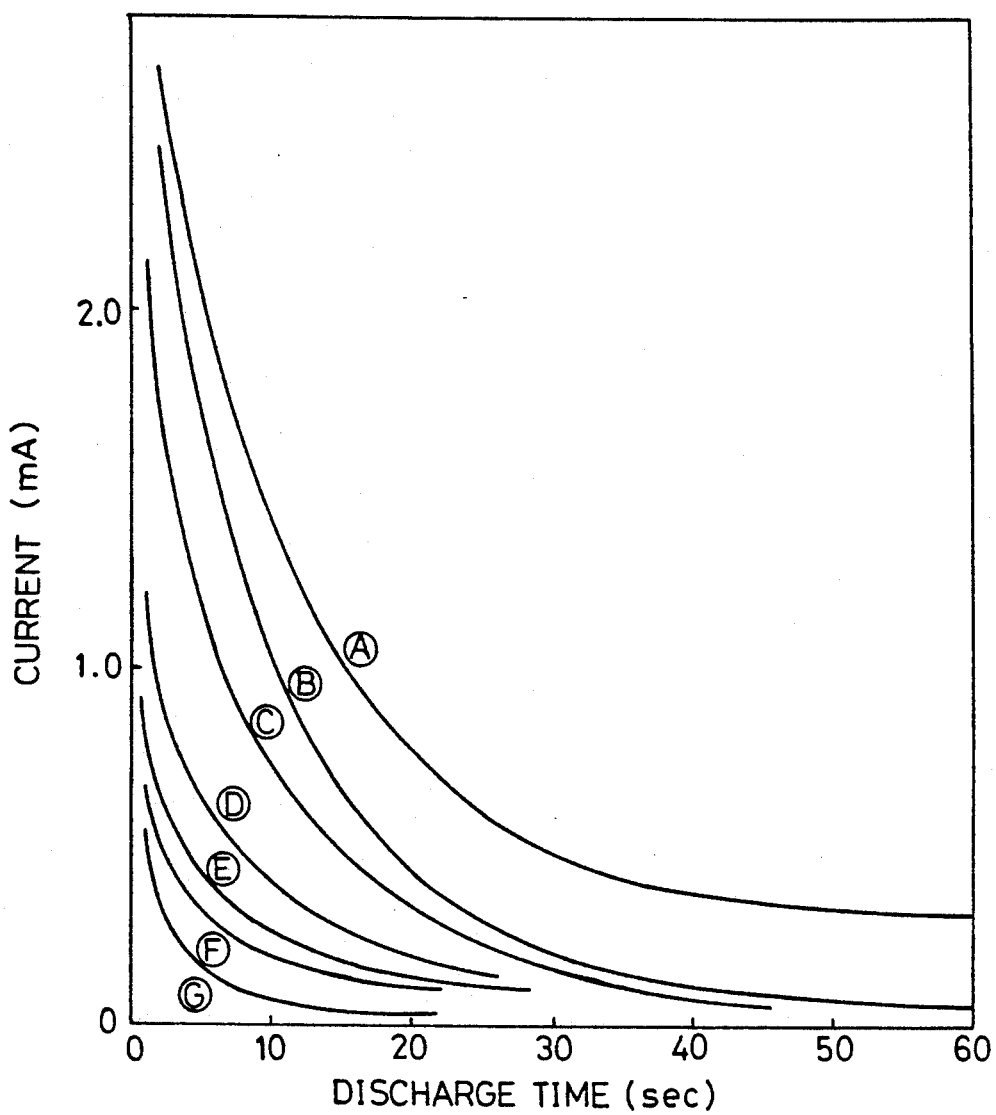

Each of these developers was disposed in the above testing cell, measuring, for each developer, the change with passage of time in the discharge current as from the time when the external wiring was connected. The measurement results are shown in FIG. 7, in which the vertical axis represents the current (mA) and the horizontal axis represents the time (sec.) which elapses from the time when the discharge is started. The symbols by the respective curves correspond to the developers set forth in Table 1.

As can be seen from FIG. 7, the amount of discharge current in the testing cell depends upon on the type of developer (the electrolyte 21). The amount of discharge current, however, can be reduced to a large degree by adding a small amount of D-glucose to the developer; it can be reduced to a tenth or fifteenth as compared to the case where no D-glucose is added. This is due to the fact that the molecules of the D-glucose added to the developer are adsorbed on the surface of the Al film, thereby mitigating the dissolution of Al.

REFERENCE EXAMPLE 2

Figure 8:
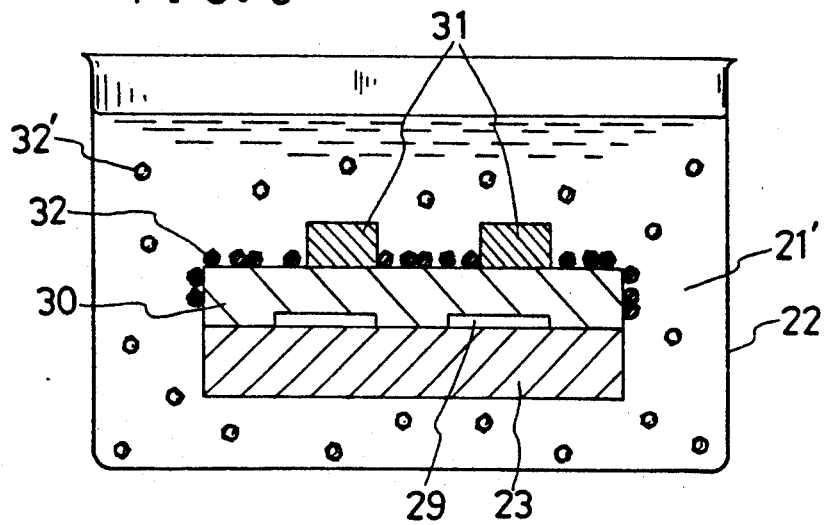

FIG. 8 is a sectional view showing the process of developing a photo resist material 31 on a Al film 30 when forming an Al electrode pattern.

In the example shown in FIG. 8, the Al film 30, covering an ITO electrode pattern formed on a glass substrate 23, is deposited on the entire surface of the substrate. The photo resist material 31 to be developed is provided for the purpose of making an electrode pattern out of the Al film 30 by photoetching.

The substrate 23, etc. are immersed in a developer 21' provided in a bath 22. D-glucose 32 is added to the developer 21' and is adsorbed on the surface of the Al film 30, thereby forming a D-glucose protective layer.

Immediately after its deposition, or after the sequent heat treatment, the Al film exhibits active corrosion points in high density. These active corrosion points, which are attributable, for example, to impurity deposits, distortion or lattice defects, are subject to local corrosion, so that, if the photo resist 31 were developed in the developer 21', which is a strong alkaline electrolyte (e.g., sodium phosphate), without covering the Al film with a protective layer, dissolution of Al would take place at the active corrosion points on the exposed Al surface, thereby forming pinholes. When these pinholes in the Al film 30 reached the ITO film 29, a local cell would be formed since different metals, connected to each other, would then be immersed in an electrolyte. As a result, the ITO film 29 would also be corroded. In accordance with this invention, however, an appropriate amount of D-glucose is added to the electrolyte, as stated above, so that D-glucose molecules are adsorbed on the surface of the Al film, thereby mitigating the Al corrosion and reducing the corrosion current between the ITO and Al. In this way, the corrosion of the ITO film can be avoided.

In the Al films 30 described above, the density of the active corrosion points depends on the depositing condition, the after-treatment condition, etc. Further, the rate of Al dissolution at the pinholes in the Al film 30 also varies depending on the type of developer used. When, however, an appropriate amount of D-glucose 32, 32' is added to the developer 21', as in this reference example, with reference to FIG. 7, the molecules of the D-glucose 32 added are adsorbed on the surface of the Al film, thereby protecting the Al film 30 and the ITO film 29 from corrosion and making it possible to perform the development of the photo resist more efficiently.

EXAMPLE 3

Figure 9:
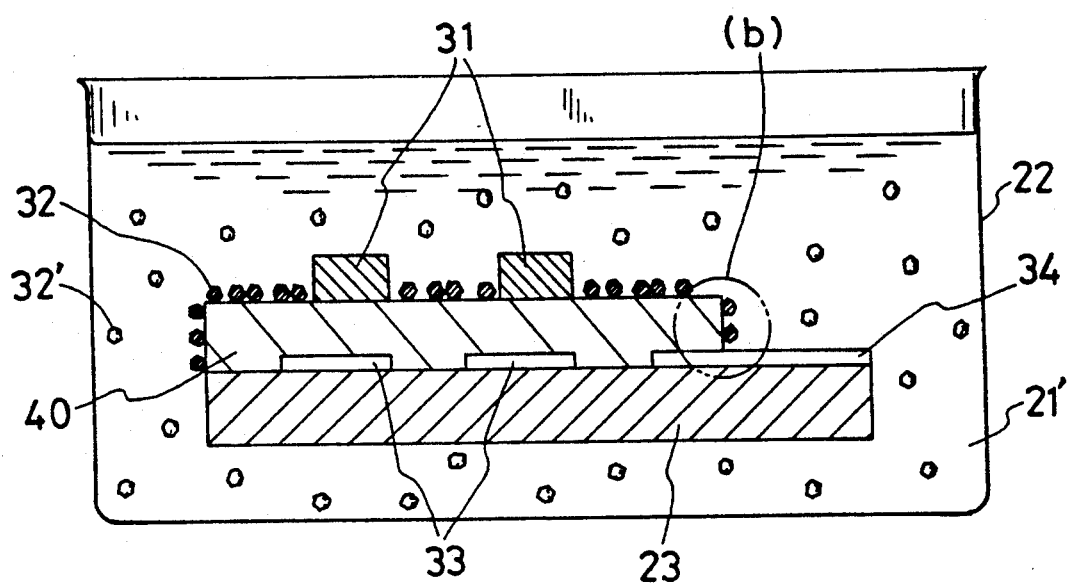
FIGS. 9(a) and 9(b) are process drawings illustrating a third embodiment of this invention.
Figure 9:
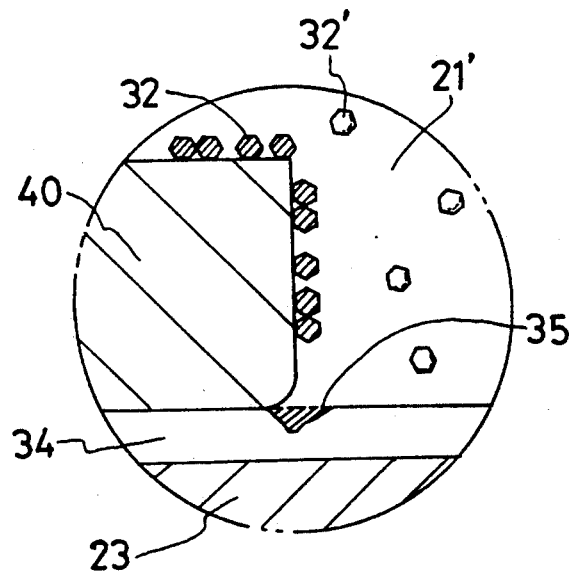

FIGS. 9(a) and 9(b) are sectional views showing a third example of this invention. Since FIG. 9(a) shows the same process as FIG. 8 and employs the same reference numerals, a description of the identical parts will be omitted. The improvement in this embodiment consists in the provision of an auxiliary ITO film 34, which is electrically connected to the Al film 30 and at least a part of which is not covered with the Al film 30.

The above arrangement of the third example provides the following advantage: it can happen, when developing the photo resist 31, that the Al dissolution on the surface of the Al film 30 cannot be mitigated in spite of the addition of D-glucose if its amount is not enough. Pinholes would then be formed on the Al film 30, as described above. As a result, the connecting section between the ITO and Al would be immersed in the electrolyte, causing a corrosion current to flow, which would stimulate electrochemical corrosion. In this example, however, the area around the borderline between the auxiliary ITO film 34 and the Al film 30 thereon acts as a local cell system which is much more large-scaled than the local cell systems formed in the pinholes, so that a difference is generated in the concentration polarization which causes the reaction of the anodes and cathodes, causing the corrosion current to be concentrated on this local cell system formed by the auxiliary ITO film 34. Accordingly, if an large corroded portion 35 is formed in the auxiliary ITO film 34, it stops the operation of the other local cell systems formed in the pinholes of the Al film 30, thereby preventing the corrosion in the pinholes from proceeding.

Thus, in accordance with the third example of this invention, corrosion can be avoided more positively by the combined effect of the adsorption of the molecules of the D-glucose 32 and the concentration of the corrosion current caused by the auxiliary ITO film.

As described above, this invention makes it possible to avoid the corrosion of transparent electrodes during the development of Al electrodes formed on them by photoetching, thereby preventing electrode defects from being generated.

Furthermore, Al is an inexpensive metal and is highly conformable to the sequent processes, so that, when compared to the case where the corrosion of the ITO electrodes is avoided by using, for example, Ti, it allows electrodes to be manufactured more economically. Moreover, since the film to be protected and the auxiliary film are of the same type, the production process is simplified.

The present invention is also advantageous in that the Al film can be made thin. Pinholes are easily generated in a thin Al film. In this invention, however, that is not a problem since the transparent electrodes are protected from corrosion as described above. In addition, the preparation conditions for the Al film can be less rigid.

Thus, this invention, makes it possible to produce devices which need the formation of Al films on transparent electrodes, e.g., close contact type image sensors or liquid crystal display devices, in high yields and at low cost.

What is claimed is:

1. An electrode pattern forming method comprising the steps of:
   forming a primary transparent conductive film and an auxiliary transparent conductive film on first and second substrates, respectively;
   covering said primary transparent conductive film with an aluminum film;
   forming a photoresist on said aluminum film;
   exposing said photoresist;
   developing said photoresist by electrically connecting said primary film and said auxiliary film and immersing said first substrate and a portion of said second substrate in an electrolyte to prevent corrosion of said primary film and to form a photoresist pattern; and
   etching said aluminum film using said photoresist pattern as a mask.

2. The method of claim 1 in which said primary and auxiliary transparent conductive films are indium-tin-oxide (ITO) films.

3. The method of claim 1 in which the aluminum film has a thickness of 0.5 to 2.0 μm.

4. The method of claim 1 in which the photoresist is made of a positive type resist material.

5. The method of claim 4 in which the positive type resist material is of an acrylate or synthetic rubber type.

6. The method of claim 1 in which the photoresist is made of negative quinonediazine type resist material.

7. The method of claim 1 in which the photoresist has a thickness of 1.0 to 2.0 μm.

8. The method of claim 1 in which said auxiliary transparent conductive film is an indium-tin-oxide (ITO) film.

9. The method of claim 1 in which the electrolyte is a sodium phosphate type alkaline solution.

10. The method of claim 1 in which the electrolyte contains a saccharose.

11. The method of claim 10 in which the saccharose is D-glucose.

12. The method of claim 10 in which the content of the saccharose is 1.0 to 3.0 wt %.

13. A electrode pattern forming method comprising the steps of:

forming spaced-apart first and second transparent conductive films on substrate material;

covering at least said first transparent conductive film and a portion of said second transparent conductive film with an aluminum film;

forming a photoresist film on said aluminum film;

exposing said photoresist film;

developing said photoresist film by immersing said substrate material in an electrolyte containing a saccharose to form a photoresist pattern; and etching said aluminum film using said photoresist pattern as a mask.

14. The method according to claim 13 wherein said first transparent conductive film is formed on a first substrate and said second transparent conductive film is formed on a second physically-separated substrate, said first and second films being electrically connected during said developing step with said second film partially immersed in said electrolyte.

15. The method according to claim 13, wherein said first and second films are formed on a single substrate and said second film is partially covered with said aluminum film.

16. A method for forming an electrode pattern comprising:

forming first and second separate transparent conductive films on at least one substrate;

covering all of said first film and a portion of said second film with an aluminum film;

forming a photoresist on the aluminum film;

exposing said photoresist;

developing said photoresist by immersing said substrate in an electrolyte to form a photoresist pattern, wherein said second film serves as a sacrifice anode to prevent corrosion of said first film; and etching said aluminum film using said photoresist pattern as a mask.

17. The method of claim 16 in which said first and second transparent conductive films are indium-tin-oxide (ITO) films.

18. The method of claim 16 wherein the photoresist is made of a positive type resist material of an acrylate or synthetic rubber.

19. The method of claim 16 wherein said aluminum film electrically connects said first and second films.

20. The method of claim 16 in which the electrolyte contains a saccharose.

21. The method of claim 20 in which the saccharose is D-glucose.

22. The method of claim 16 in which said corrosion is substantially localized at an edge interface of said second transparent conductive film and said aluminum film.

* * * * *